(12) United States Patent
Suh et al.

(10) Patent No.: US 8,248,119 B2
(45) Date of Patent: Aug. 21, 2012

(54) LOW POWER FREQUENCY DIVIDER AND LOW POWER PHASE LOCKED LOOP INCLUDING THE SAME

(75) Inventors: Young Suk Suh, Daegu (KR); Young Sik Kim, Pohang-si (KR)

(73) Assignee: Industry-Academic Cooperation Foundation, Yeungnam University, Gyeongsan-Si, Gyeongsangbuk-Do (KR)

( * ) Notice: Subject to any disclaimer, the term of this patent is extended or adjusted under 35 U.S.C. 154(b) by 90 days.

(21) Appl. No.: 12/997,421

(22) PCT Filed: Jun. 11, 2009

(86) PCT No.: PCT/KR2009/003135
§ 371 (c)(1),
(2), (4) Date: Dec. 10, 2010

(87) PCT Pub. No.: WO2009/151285
PCT Pub. Date: Dec. 17, 2009

(65) Prior Publication Data
US 2011/0084738 A1    Apr. 14, 2011

(30) Foreign Application Priority Data
Jun. 13, 2008 (KR) .................. 10-2008-0055557

(51) Int. Cl.
*H03B 19/00* (2006.01)
(52) U.S. Cl. ..................... 327/117; 327/115; 377/47

(58) Field of Classification Search .................. None
See application file for complete search history.

(56) References Cited

U.S. PATENT DOCUMENTS

| | | | |
|---|---|---|---|
| 4,244,043 A | 1/1981 | Fujita et al. | |
| 6,356,123 B1 | 3/2002 | Lee et al. | |
| 6,703,880 B1 * | 3/2004 | Gailhard et al. | 327/159 |
| 6,894,571 B2 | 5/2005 | Sumi et al. | |
| 2003/0042948 A1 | 3/2003 | Sumi | |
| 2003/0048863 A1 | 3/2003 | Saeki | |

FOREIGN PATENT DOCUMENTS

| | | |
|---|---|---|
| JP | 2001-117666 | 4/2001 |
| JP | 2003-87113 | 3/2003 |

* cited by examiner

*Primary Examiner* — An Luu
(74) *Attorney, Agent, or Firm* — Sherr & Vaughn, PLLC

(57) ABSTRACT

A low power frequency divider and a low power phase locked loop, which consume the least power. The low power frequency divider generates a frequency dividing signal by dividing a frequency of an input signal in a uniform ratio, and includes a phase to voltage converter, a comparator, a phase synchronization circuit, and a reset circuit. The phase to voltage converter generates a phase voltage signal corresponding to phase change of the input signal in response to a reset signal. The comparator generates a comparator signal by comparing the phase voltage signal and a reference phase voltage signal. The phase synchronization circuit generates the frequency dividing signal by matching phases of the input signal and the comparator signal. The reset circuit generates the reset signal in response to the comparator signal or the frequency dividing signal.

12 Claims, 2 Drawing Sheets

LOW POWER FREQUENCY DIVIDER AND LOW POWER PHASE LOCKED LOOP INCLUDING THE SAME

CROSS REFERENCE TO PRIOR APPLICATIONS

This application is a National Stage Patent Application of PCT International Patent Application No. PCT/KR2009/003135 (filed on Jun. 11, 2009) under 35 U.S.C. §371, which claims priority to Korean Patent Application No. 10-2008-0055557 (filed on Jun. 13, 2008), which are all hereby incorporated by reference in their entirety.

BACKGROUND OF THE INVENTION

1. Field of the Invention

The present invention relates to a frequency divider and a phase locked loop, and more particularly, to a low power frequency divider and a low power phase locked loop, which consume the least power.

2. Description of the Related Art

A frequency divider performs a function of dividing a frequency of an input signal, and generally includes a counter circuit used to recognize the frequency of the input signal. The counter circuit recognizes the frequency of the input signal by using a plurality of transistors that are turned on or turned off in response to the input signal, and generates a signal by dividing the frequency of the input signal in a uniform ratio according to the recognized frequency.

Since a current is mostly used at a switching moment when a transistor repeats turned on and turned off states, an operation speed of the counter circuit determines power consumption of the frequency divider. The frequency divider is mostly used in a phase locked loop, and since power consumption of the counter circuit constitutes most of the power consumption of the frequency divider, power consumption of the phase locked loop including the frequency divider including the counter circuit having such electric characteristics is also increased.

SUMMARY OF THE INVENTION

The present invention provides a low power frequency divider.

The present invention also provides a low power phase locked loop.

According to an aspect of the present invention, there is provided a low power frequency divider generating a frequency dividing signal by dividing a frequency of an input signal in a uniform ratio, and including a phase to voltage converter, a comparator, a phase synchronization circuit, and a reset circuit. The phase to voltage converter generates a phase voltage signal corresponding to phase change of the input signal in response to a reset signal. The comparator generates a comparator signal by comparing the phase voltage signal and a reference phase voltage signal. The phase synchronization circuit generates the frequency dividing signal by matching phases of the input signal and the comparator signal. The reset circuit generates the reset signal in response to the comparator signal or the frequency dividing signal.

According to another aspect of the present invention, there is provided a low power phase locked loop including a phase frequency detector, a charge pump, a loop filter, a voltage controlled oscillator, and a frequency divider. The phase frequency detector generates a detecting signal corresponding to a phase difference and a frequency difference between an input signal and a frequency dividing signal. The charge pump adjusts an amount of charge supplied according to the detecting signal, and generates a charge pump signal corresponding to the adjusted amount of charge. The loop filter generates a control voltage corresponding to the charge pump signal. The voltage controller oscillator generates a phase lock signal in response to the control voltage. The frequency divider generates the frequency dividing signal by dividing a frequency of the phase lock signal, Here, the frequency divider includes a phase to voltage converter, a comparator, a phase synchronization circuit, and a reset circuit. The phase to voltage converter generates a phase voltage signal corresponding to phase change of the input signal in response to a reset signal. The comparator generates a comparator signal by comparing the phase voltage signal and a reference phase voltage signal. The phase synchronization circuit generates the frequency dividing signal by matching phases of the input signal and the comparator signal. The reset circuit generates the reset signal in response to the comparator signal or the frequency dividing signal.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Hereinafter, the present invention will be described more fully with reference to the accompanying drawings, in which exemplary embodiments of the invention are shown.

Figure 1:
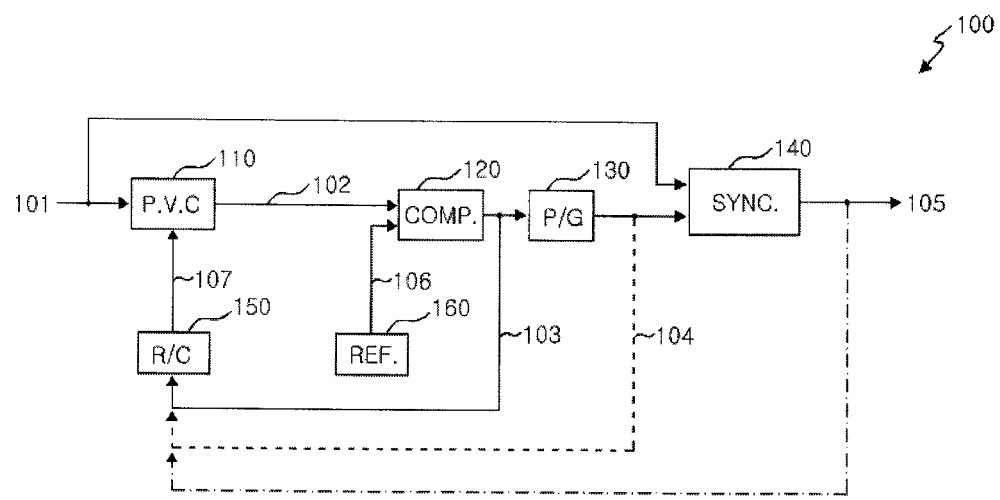
FIG. 1 is a block diagram of a low power frequency divider according to an embodiment of the present invention.

FIG. 1 is a block diagram of a low power frequency divider 100 according to an embodiment of the present invention.

Referring to FIG. 1, the low power frequency divider 100 includes a phase to voltage converter 110, a comparator 120, a pulse generator 130, a phase synchronization circuit 140, a reset circuit 150, and a reference phase voltage generator 160.

The phase to voltage converter 110 generates a phase voltage signal 102 corresponding to phase change of an input signal 101 in response to a reset signal 107. The comparator 120 generates a comparator signal 103 by comparing the phase voltage signal 102 and a reference phase voltage signal 106. The pulse generator 130 generates a pulse signal 104 corresponding to the comparator signal 103. The phase synchronization circuit 140 generates a frequency dividing signal 105 by matching phases of the input signal 101 and the comparator signal 103. The reset circuit 150 generates the reset signal 107 in response to one of the comparator signal 103, the pulse signal 104, and the frequency dividing signal 105.

The phase voltage signal 102 is a signal changing a size of a voltage corresponding to the input signal 101 according to the phase change of the input signal 101, and may be generated by integrating the input signal 101 for a fixed time.

The pulse signal 104 may be generated by using the comparator signal 103, wherein a frequency of the pulse signal 104 is equal to or half of a frequency of the comparator signal 103. Here, the pulse generator 130 may be actually realized by generating the pulse signal 104 by dividing the frequency of the comparator signal 103 received by using a D-type flip flop by half.

A frequency of the frequency dividing signal 105 is determined based on a dividing ratio determined by the reference phase voltage signal 106, which will be described later.

Also, the reset signal 107 is an edge trigger signal that is triggered by a rising edge or a falling edge of one of the comparator signal 103, the pulse signal 104, and the frequency dividing signal 105, and is used to initialize the phase to voltage converter 110.

Figure 2:
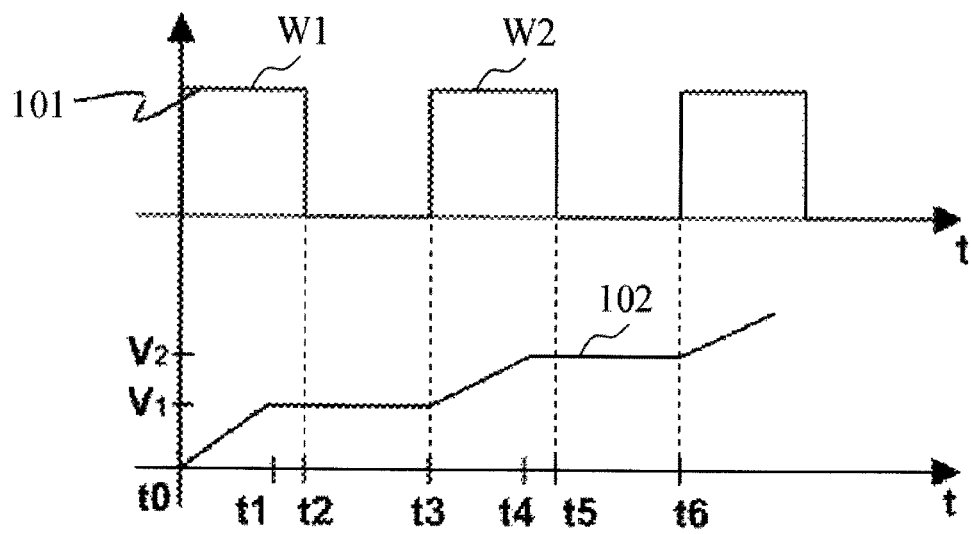
FIG. 2 is a waveform diagram illustrating an input signal and a phase voltage signal of a low power frequency divider.

FIG. 2 is a waveform diagram illustrating the input signal 101 and the phase voltage signal 102 of the low power frequency divider 100.

Referring to FIG. 2, when the input signal 101 is a square wave pulse having a uniform frequency, the phase voltage signal 102 is a signal obtained by integrating the input signal 101 for a fixed time. A first integrated voltage V1 is obtained by integrating a first square wave pulse W1 for a [t1-t0] time, and a second integrated voltage V2 is obtained by integrating a second square wave pulse W2 for a [t4-t3] time. An output of an integrator (not shown) maintains an accumulated voltage value in a non-integration section. Accordingly, a voltage level of the phase voltage signal 102 increases in proportion to a number of square wave pulses included in a fixed determination section. Here, the voltage level of the phase voltage signal 102 is a value obtained by multiplying the first integrated voltage V1 to the number of square wave pulses.

Figure 3:
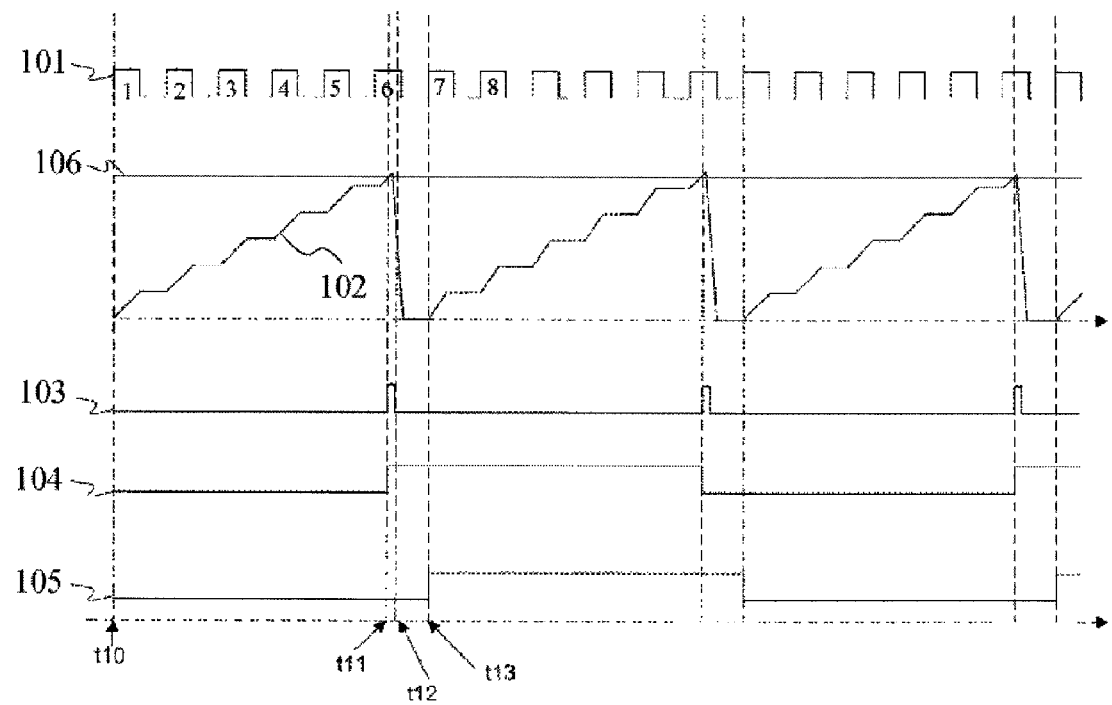
FIG. 3 is a waveform diagram illustrating an input signal of a low power frequency divider and internal nodes of the low power frequency divider, which change according to the input signal.

FIG. 3 is a waveform diagram illustrating the input signal 101 of the low power frequency divider 100 and internal nodes of the low power frequency divider 100, which change according to the input signal 101.

Referring to FIG. 3, integration is performed until a time t11 when a voltage size of the phase voltage signal 102 obtained by integrating the input signal 101 is larger than the predetermined reference phase voltage signal 106, and a number of square wave pulses included in an integration section may be calculated from a voltage value of the integrated phase voltage signal 102. In FIG. 3, 5¼ square wave pulses of the input signal 101 are included in an integration section during [t11-t10]. When this is calculated in a phase, the phase is 1890°(=360°×5.25). A size of the reference phase voltage signal 106 may be changed according to a frequency of the frequency dividing signal 105 to be generated.

A logic state of the comparator signal 103 is transited at the time t11 when the voltage size of the phase voltage signal 102 obtained by integrating the input signal 101 is larger than the predetermined reference phase voltage signal 106. In FIG. 3, the comparator signal 103 is transited from a logic low state to a logic high state. Although not illustrated in FIG. 3, the phase to voltage converter 110 is initialized by the reset signal 107 constituting an edge trigger signal of the comparator signal 103, and the logic state of the comparator signal 103 is again transited accordingly, at a time t12.

The comparator signal 103 is changed to the pulse signal 104 through the pulse generator 130. As described above, the pulse signal 104 shown in FIG. 3 may be easily generated by using a D-type flip flop.

The frequency dividing signal 105 is generated by matching synchronizations of the pulse signal 104 and the input signal 101, and is generated by the phase synchronization circuit 140. The phase synchronization circuit 140 may match the synchronizations of the pulse signal 104 and the input signal 101 by using any one of various methods. For example, a rising edge (the time t11) of the comparator signal 103 is detected, and then a rising edge of the pulse signal 104 is matched to a rising edge (the time t13) of a pulse 7 of the input signal 101, which is initially recognized.

The pulse signal 104 is newly integrated from the time t13 when the rising edge of the input signal 101 is matched, i.e., when the frequency dividing signal 105 is transited to a logic high state, and thus the voltage level of the phase voltage signal 102 starts to increase.

Referring to FIG. 3, a period of the generated frequency dividing signal 105 is 6 times higher than a period of the input signal 101 because a number of pulses higher than 5 and less than 6 is recognized in all of an integration section (t10 to t11).

Figure 4:
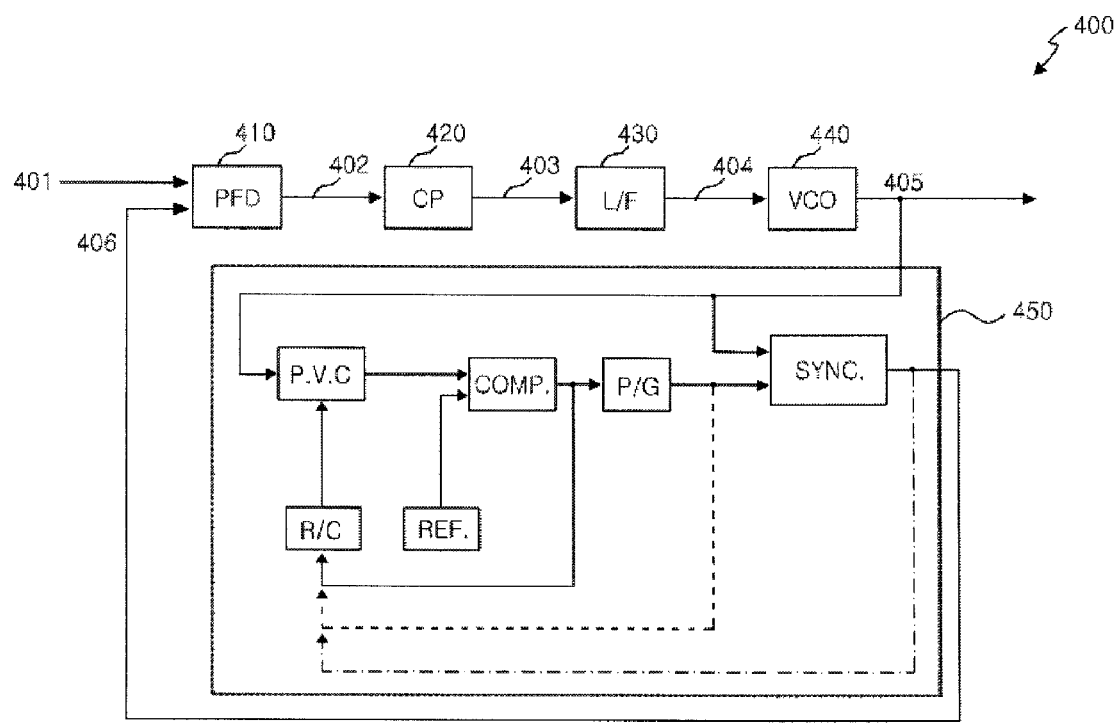
FIG. 4 is a bock diagram of a low power phase locked loop according to an embodiment of the present invention.

FIG. 4 is a bock diagram of a low power phase locked loop 400 according to an embodiment of the present invention.

Referring to FIG. 4, the low power phase locked loop 400 includes a phase frequency detector 410, a charge pump 420, a loop filter 430, a voltage controlled oscillator 440, and a frequency divider 450.

The phase frequency detector 410 generates a detecting signal 402 corresponding to a phase difference and a frequency difference between an input signal 401 and a frequency dividing signal 406. The charge pump 420 adjusts an amount of charge supplied according to the detecting signal 402, and generates a charge pump signal 403 corresponding to the adjusted amount of charge. The loop filter 430 generates a control voltage 404 corresponding to the charge pump signal 403. The voltage controlled oscillator 440 generates a phase lock signal 405 in response to the control voltage 404. The frequency divider 450 generates the frequency dividing signal 406 by dividing a frequency of the phase lock signal 405.

Here, the frequency divider 450 corresponds to the low power frequency divider 100 of FIG. 1, and since operations of the low power phase locked loop 400 of FIG. 4 are well known, electric characteristics and operations of the lower power phase locked loop 400 will be omitted herein.

Generally, power consumption of a digital circuit is in proportion to a switching frequency and a number of devices that perform switching. For example, in order to reduce a frequency of a clock signal having a frequency of 100 MHz to $$\frac{100}{128}$$

MHz, seven D-type flip flops are used. Here, the first D-type flip flop operates in a frequency of $$\frac{100}{2}$$

MHz, the second D-type flip flop operates in a frequency of $100/4$ MHz, and the last D-type flip flop operates in a frequency of $$\frac{100}{2^7} = \frac{100}{128}$$

MHz. Accordingly, the seven D-type flip flops continuously switched from 50 MHz to MHz, and power consumption is high due to the continuous switching.

However, according to a low power frequency divider and a low power phase locked loop using the low power frequency divider according to the present invention, a number of devices performing switching may be remarkably reduced since a number of clocks is measured by storing charge proportional to a number of pulses of an input signal and determining a time when the voltage reaches a certain section, instead of a plurality of devices like flip flops continuously switching so as to count a frequency of the input signal. Accordingly, power consumptions of the low power frequency divider and the low power phase locked loop of the present invention are lower than power consumptions of a conventional frequency divider and a conventional phase locked loop.

Specifically, since a frequency dividing signal output from the low power frequency divider can be synchronized with the input signal, the low power frequency divider can be easily used in a circuit like a phase locked loop. The low power frequency divider and the lower power phase locked loop have optimal conditions to be used in a portable device or a sensor node chip, which are driven by a battery, wherein power consumption is an important matter.

The low power frequency divider and the low power phase locked loop including the low power frequency divider of the present invention have low power consumption, and thus life of a circuit can be increased.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A low power frequency divider that generates a frequency dividing signal by dividing a frequency of an input signal at uniform ratio, the low power frequency divider comprising:
    a phase to voltage converter for generating a phase voltage signal corresponding to phase change of the input signal, in response to a reset signal;
    a comparator for generating a comparator signal by comparing the phase voltage signal and a reference phase voltage signal;
    a phase synchronization circuit for generating the frequency dividing signal by matching phases of the input signal and the comparator signal; and
    a reset circuit for generating the reset signal in response to the comparator signal or the frequency dividing signal.

2. The low power frequency divider of claim 1, further comprising a pulse generator for generating a pulse signal corresponding to the comparator signal, wherein the phase synchronization circuit generates the frequency dividing signal by matching phases of the input signal and the pulse signal.

3. The low power frequency divider of claim 2, wherein a frequency of the comparator signal is twice a frequency of the pulse signal.

4. The low power frequency divider of claim 3, wherein the pulse generator comprises a D-type flip flop for generating the pulse signal by receiving the comparator signal.

5. The low power frequency divider of claim 2, wherein the reset circuit generates the reset signal in response to one of the comparator signal, the pulse signal, and the frequency dividing signal.

6. The low power frequency divider of claim 5, wherein the reset signal is an edge trigger signal of one of the comparator signal, the pulse signal, and the frequency dividing signal.

7. The low power frequency divider of claim 1, further comprising a reference phase voltage generator for generating the reference phase voltage signal.

8. A low power phase locked loop comprising:
    a phase frequency detector for generating a detecting signal corresponding to a phase difference and a frequency difference between an input signal and a frequency dividing signal;
    a charge pump for adjusting an amount of charge supplied according to the detecting signal, and generating a charge pump signal corresponding to the adjusted amount of charge;
    a loop filter for generating a control voltage corresponding to the charge pump signal;
    a voltage controller oscillator for generating a phase lock signal in response to the control voltage; and
    a frequency divider for generating the frequency dividing signal by dividing a frequency of the phase lock signal,
    wherein the frequency divider comprises:
    a phase to voltage converter for generating a phase voltage signal corresponding to phase change of an input signal of the frequency divider, in response to a reset signal;
    a comparator for generating a comparator signal by comparing the phase voltage signal and a reference phase voltage signal;
    a phase synchronization circuit for generating the frequency dividing signal by matching phases of the input signal of the frequency divider and the comparator signal; and
    a reset circuit for generating the reset signal in response to the comparator signal or the frequency dividing signal.

9. The low power phase locked loop of claim 8, further comprising a pulse generator for generating a pulse signal corresponding to the comparator signal,
    wherein the phase synchronization circuit generates the frequency dividing signal by matching phases of the input signal of the frequency divider and the pulse signal.

10. The low power phase locked loop of claim 9, wherein the pulse generator comprises a D-type flip flop that generates the pulse signal by receiving the comparator signal.

11. The low power phase locked loop of claim 9, wherein the reset circuit generates the reset signal in response to one of the comparator signal, the pulse signal, and the frequency dividing signal, and
    the reset signal is an edge trigger signal of one of the comparator signal, the pulse signal, and the frequency dividing signal.

12. The low power phase locked loop of claim 8, further comprising a reference phase voltage generator for generating the reference phase voltage signal.

* * * * *